United States Patent
Ma et al.

(10) Patent No.: US 10,454,427 B2
(45) Date of Patent: Oct. 22, 2019

(54) POWER AMPLIFIER SYSTEM AND LEARNING-BASED AUTOTUNING METHOD THEREOF

(71) Applicant: Mitsubishi Electric Research Laboratories, Inc., Cambridge, MA (US)

(72) Inventors: Rui Ma, Lexington, MA (US); Mouhacine Benosman, Boston, MA (US); Koushik Manjunatha, Tuscaloosa, AL (US); Sufeng Niu, Central, SC (US); Daniel Antonio Da Costa Dinis, Santa Comba Dao (PT)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/800,724

(22) Filed: Nov. 1, 2017

(65) Prior Publication Data

US 2019/0131933 A1    May 2, 2019

(51) Int. Cl.
| | |
|---|---|
| *H03F 1/07* | (2006.01) |
| *H03F 1/02* | (2006.01) |
| *H03F 1/32* | (2006.01) |
| *H03F 3/21* | (2006.01) |
| *H03F 3/26* | (2006.01) |
| *H03F 3/193* | (2006.01) |
| *H03F 3/195* | (2006.01) |
| *H03F 3/24* | (2006.01) |

(52) U.S. Cl.
CPC ......... *H03F 1/0233* (2013.01); *H03F 1/0272* (2013.01); *H03F 1/0288* (2013.01); *H03F 1/3241* (2013.01); *H03F 3/193* (2013.01); *H03F 3/195* (2013.01); *H03F 3/21* (2013.01); *H03F 3/245* (2013.01); *H03F 3/265* (2013.01); *H03F 2200/451* (2013.01); *H03F 2201/3212* (2013.01)

(58) Field of Classification Search
CPC ................................. H03F 1/07; H03F 1/0288
USPC .............................................. 330/295, 124 R
See application file for complete search history.

(56) References Cited

U.S. PATENT DOCUMENTS

| | | | |
|---|---|---|---|
| 6,054,896 A * | 4/2000 | Wright | .................. H03F 1/0294 330/149 |
| 9,184,703 B2 | 11/2015 | Cho et al. | |
| 9,374,041 B2 | 6/2016 | Liu | |

(Continued)

FOREIGN PATENT DOCUMENTS

JP        2009100429 A    10/2007

*Primary Examiner* — Henry Choe
(74) *Attorney, Agent, or Firm* — Gennadiy Vinokur; James McAleenan; Hironori Tsukamoto (57) ABSTRACT

A Digital Power-Amplifier (DPA) system includes a power amplifier (PA) circuit having control inputs and an output for generating output signals, and an adaptive control circuit that comprises an input interface, an output interface, a memory storing an adaptive control algorithm and a processor performing instructions based on the adaptive control algorithm in connection with the memory, wherein the input interface receives input-state signals and output signals of the DPA circuit, wherein the adaptive control algorithm determines, in response to the input-state signals and the output signals, control parameters of control signals transmitted to the control inputs from the output interface for controlling operations of the DPA circuit.

17 Claims, 9 Drawing Sheets

(56) References Cited

U.S. PATENT DOCUMENTS

| | | |
|---|---|---|
| 2002/0101937 A1 | 8/2002 | Franklin et al. |
| 2004/0263246 A1 | 12/2004 | Robinson et al. |
| 2008/0111622 A1 | 5/2008 | Sperlich et al. |
| 2010/0074367 A1 | 3/2010 | Kim et al. |
| 2010/0237948 A1 | 9/2010 | Nguyen et al. |
| 2013/0021104 A1* | 1/2013 | Schmidt ............... H03F 1/0277 330/295 |
| 2013/0287140 A1* | 10/2013 | Zhang .................. H04L 27/367 375/296 |
| 2015/0180426 A1 | 6/2015 | Kingsley |
| 2016/0204743 A1 | 7/2016 | Otsuki et al. |
| 2017/0077945 A1* | 3/2017 | Pagnanelli ............. H03M 3/40 |

* cited by examiner

POWER AMPLIFIER SYSTEM AND LEARNING-BASED AUTOTUNING METHOD THEREOF

FIELD OF THE INVENTION

The present invention is related to a power amplifier system, and more particularly to a digital Doherty power amplifier system and a learning-based autotuning optimization method of a power amplifier system for enhancing performance of radio frequency power amplifier.

BACKGROUND OF THE INVENTION

The rapid growing of wireless communication data volume and rate significantly raise the power consumption in wireless transmitters, in which the power amplifier (PA) is the key component for energy consumption. Several advanced techniques including Envelope Tracking (ET), Doherty Power Amplifier (DPA), Envelop Elimination and Restoration (EER) have been proposed to improve the Power Added Efficiency (PAE) of PA. Among these techniques, DPA is very promising thanks to its simple structure enabling high average efficiency, which is on the basis of active load modulation.

Although the DPA shows numerous advantages for efficiency enhancement, traditional analog DPA still suffers from imperfection which results in a degraded performance in terms of energy efficiency and operational bandwidth. Traditional DPA design is based on single input configuration that contains an analog power splitter (maybe tunable), fixed phase alignment, carrier PA running on class-AB and peak PA running on class-C mode, as well as an output power combiner. To improve DPA efficiency, several methods are studied, including gate bias adaption, asymmetrical DPA, multi-way DPA, tunable phase alignment, and adaptive power splitting ratio.

In order to obtain the optimal PA performance, the designer needs to manually tune the circuit operation parameters and the tuning process is only valid for fixed operating conditions such as input power, frequency, and signal standard. While in the practical scenarios, the optimal control parameters do vary with changing inputs and circuit states. The compensation circuit part is also complicated and challenging to optimize, making DPA design cumbersome. These are very limitations from pure analog based design.

There is a need for a more flexible architecture such as digital DPAs (DDPAs) to adaptively find the optimal control parameters for various circuit states and input signals of various bandwidths, modulation formats, power levels and modulation formats.

SUMMARY OF THE INVENTION

Some embodiments are based on recognition that a Digital Power Amplifier (DPA) is programmable, so that it facilitates circuit tuning procedure (autotunig) for designer and can take into account on circuit imbalance such as phase delay for multiple paths and environment changes including temperatures. Therefore, the DPA is not only flexible, but also able to provide enhanced performance compared with analog DPAs.

According to embodiments of the present invention, a DPA system, a Digital Doherty Power Amplifier (DDPA) system and a learning-based autotuning method (optimization method) are provided, which particularly improve the efficiency and gain of PA by adaptive control meeting linearity requirement at the same time. The DDPA system and the optimization method can be used for broadband mobile communications including 3G, 4G LTE and coming 5G base station radio front end of the transmitters.

Some embodiments of the present invention provide a Digital Doherty amplifier (DDA) system that fully adaptively finds the optimal control parameter set, in-spite of device parameters, environment variances without complicated engineering tunings, where optimal control aims, for example, at high efficiency with reasonable gain in wideband power transmitter.

One embodiment of the invention is model-free algorithm that does not have assumptions or prior knowledge on DPA devices, where the algorithm is based on black-box optimization to search the optimal configuration. Some of embodiments not only optimize on DPA efficiency, but also enhance the gain and linearity property in a flexible way. For example, in some embodiments, the system can balance the gain and efficiency trade-off in different bands, or maximize the efficiency under certain constraints. One example is to optimize efficiency while requiring gain greater than configured threshold. In the case of Modulated signal, we optimize Efficiency, Gain along with Adjacent Channel Power Ratio (ACPR) under the same DDPA scenario. ACPR is the important factor in modulated signal to have limited power emitted from main channels to adjacent channels.

According to embodiments of the present invention, a Digital Power Amplifier (DPA) system includes a power amplifier (PA) circuit having control inputs and an output for generating output signals; and an adaptive control circuit comprised of an input interface, an output interface, a memory storing an adaptive control algorithm and a processor performing instructions based on the adaptive control algorithm in connection with the memory, wherein the input interface receives input-state signals and output signals of the PA circuit, wherein the adaptive control algorithm determines, in response to the input-state signals and the output signals, control parameters of control signals transmitted to the control inputs from the output interface for controlling operations of the PA circuit.

Further, according to another embodiment of the present invention, a Digital Doherty Power-Amplifier (DDPA) system includes a Doherty power amplifier (DPA) circuit having control inputs and an output for generating output signals; and an adaptive control circuit comprises an input interface, an output interface, a memory storing an adaptive control algorithm and a processor performing instructions based on the adaptive control algorithm in connection with the memory, wherein the input interface receives input-state signals and output signals of the DPA circuit, wherein the adaptive control algorithm determines, in response to the input-state signals and the output signals, control parameters of control signals transmitted to the control inputs from the output interface for controlling operations of the DPA circuit.

Some other embodiments take both nonlinearity and efficiency requirement into account, which decouple the linearity compensation and efficiency improvements for DDPA. Note that all compensation and enhancement components are working in digital domain.

DETAILED DESCRIPTION OF THE PREFERRED EMBODIMENTS

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Figure 1:
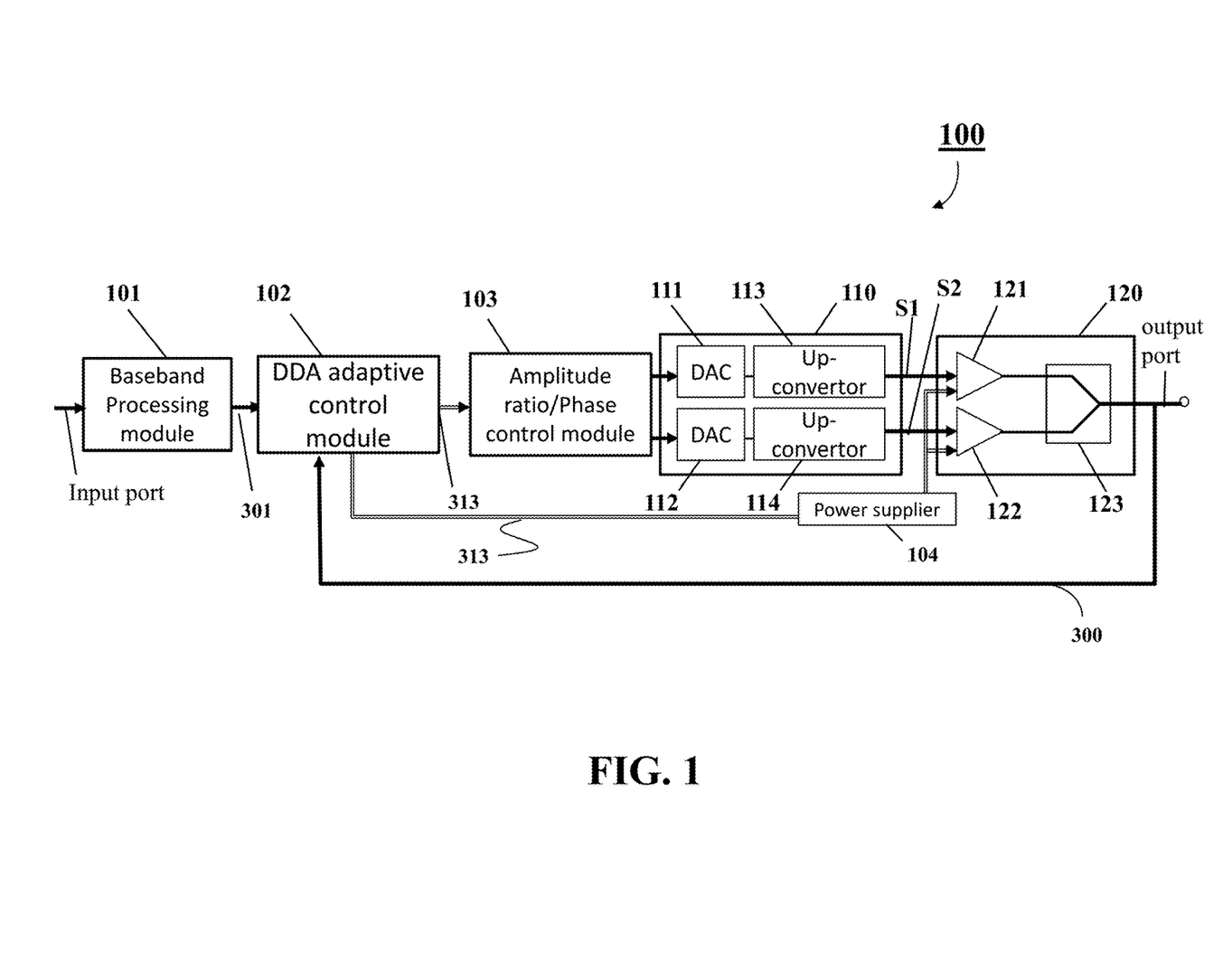
FIG. 1 is a block diagram of a DDPA hardware setup, according to some embodiments of the present invention.

FIG. 1 is a block diagram of a digital power amplifier (DPA) module 100, according to some embodiments of the present invention.

The DPA module 100 may be a digital power amplifier (DPA) module that is configured by multi-input power amplifiers such as Doherty power amplifiers, outphasing power amplifiers, balanced power amplifiers and push-pull power amplifiers etc.

As an example, Doherty power amplifiers are used in the digital power amplifier (DPA) module 100 for explain the functions of the DPA module. The DPA module 100 may be referred to as a DDPA (Digital Doherty Power Amplifier) module 100. However, it should be noted that the outphasing power amplifier circuit, the balanced power amplifier circuit or the push-pull power amplifier circuit can also be used depending upon the circuit design variations.

The DDPA module 100 may include a baseband processing module 101, a digital Doherty amplifier (DDA) adaptive control module 102, an amplitude ratio-phase control module (Amp-phase module) 103, a signal convertor 110, a dual-input DPA module (DPA module, but not limited to dual inputs) 120 and a power supplier 104 for providing bias conditions (voltage and/or current) to the DPA unit 120 according to optimal control parameters (or control parameters) 313 generated by the DDA adaptive control module 102. The DPA module 120 includes a main PA (carrier PA) 121, a peak PA 122 and an output combiner 123. The signal convertor 110 includes digital-to-analogue convertors (DACs) 111 and 112 and up-convertors 113 and 114.

The dual-input DPA 120 includes a carrier power amplifier (PA) 121 for controlling carrier signals and a peak power amplifier (PA) 122 for controlling peak signals, and the output combiner 123 for combining the signals from the carrier and peak PAs 121 and 122. It is obvious that the configuration of digital Doherty can be extended to multiway Doherty, where the more than two PA are involved with similar topologies described in 100.

The DDA adaptive control module 102 may be referred to as digital adaptive (DA) control module 102 when the power amplifiers other than Doherty amplifiers are used in the module 100.

The input signals 301 are sent to the DA adaptive control module 102. The DA adaptive control module 102 performs the data-driven optimization and generates the optimal control parameters 313 with respect to the phase difference between the PAs 121 and 122 and the input-power ratio for the PAs 121 and 122, using the input signals 301 and output signals 300 from the DPA module 120. In some cases, the control parameters 313 may be referred to as updated DDPA parameters. The updated DDPA parameters 313 are provided to the Amp-phase module 103. Further, the optimization discussed above may be referred to as a learning-based autotuning method of the power amplifier system.

In this case, the control parameters 313 include gate bias parameters of the PAs 121 and 122, phase difference between the PAs 121 and 122, and input-power distribution (ratio) for the PAs 121 and 122. Further, the power supplier 104 receives the gate bias parameters from the DDA adaptive control module 102 and applies gate bias voltages to the PAs 121 and 122 according to the gate bias parameters. When the Amp-phase module 103 receives the phase difference between the PAs 121 and 122 and the input-power ratio for the PAs 121 and 122 from the DDA adaptive control module 102 as part of the control parameters 313, the Amp-phase module 103 generates signals S1 and S2 to be applied to the PA 121 and the PA 122, respectively. In this case, the signals S1 and S2 are formed so that the amplitude ratio of the signals S1 and S2 and the phase difference between the signals S1 and S2 satisfy values indicated by the optimal control parameters 313 computed by the DDA adaptive control module 102.

In some cases, the DDA adaptive control module 102 can include the power supplier 104, and the PAs 121 and 122 can be field-effect-transistors (FETs) fabricated using gallium nitride (GaN) based materials or other different semiconductor device technologies. Further, the PAs 121 and 122 can be bipolar transistors (BPTs). In this case, the gate biases are replaced with base current biases of the bipolar transistors. The BPTs can be formed by GaN based materials or other different semiconductor device technologies.

Output signals of the output combiner 123 (for instance, quarter-wave transmission line can be used as output combining network. Further, other format such as lumped components inductors, capacitor based can also be used to conduct the same combining function) can be transmitted from an antenna (not shown) via a predetermined band pass filter (not shown). Further, the output signals of the output combiner 123 are received (detected) by the input interface (not shown) of the DDA control module 102 to compute the control parameters 313 that control the carrier PA 121 and the peak PA 122, respectively. In some cases, the control parameters 313 may be referred to as tuning parameters.

Each of the carrier and peak PAs 121 and 122 can be controlled by the control parameters 313 indicating gate-bias, phases and input-power signals. The phase-signals and input-power signals are applied to the Amp-phase module 103. The Amp-phase module 103 adjusts the amplitude ratio and phases of signals of the carrier and peak PAs 121 and 122 according to the control parameters 313 produced by the DDA adaptive control module 102.

In this case, the signal convertor 110 generates and provides the phase-signals and input-power signals to the carrier and peak PAs 121 and 122 via a drive amplifier (not shown) driving the carrier and peak PAs 121 and 122 if necessary.

The DDA adaptive control module 102 includes a processor (not shown) in connection with one or more memories (not shown) storing the adaptive control algorithm, in which the processor performs instructions according to the predetermined adaptive control algorithm. Further, the adaptive control algorithm is based on a model-free optimization called an adaptive tuning control.

The control parameters 313 are generated by the DDA adaptive control module 102 that computes the values of the control parameters 313 by the adaptive optimization control. In some cases, the control parameters 313 may be referred to as data-driven optimization parameters.

Further, the DDA adaptive control module 102 also includes an input interface (not shown) to receive the input signals 301 and the output signals 300 of the dual-input DPA module 120, and an output interface (not shown) that generates the control parameters 313 that include phase control signals, power-ratio control signals and bias-signals for controlling the dual-input DPA 120 and the carrier and peak PAs 104 and 105.

The DDA adaptive control module 102 receives baseband signals from the baseband processing module 101 and detects output signals 300 of the output combiner 106 via the input interface to produce the control parameters 313, which can be referred to as data-driven optimization parameters 313, based on the adaptive control algorithm. In this case, part of the data-driven optimization parameters 313 is provided to the Amp-phase control module 103 via the output interface for controlling phases and power ratios of the PAs 121 and 122. Further, another part of the data-driven optimization parameters 313 is converted to gate biases respectively transmitted to the PAs 121 and 122 via the power supplier 104 for controlling the gate biases of the PAs 121 and 122.

In FIG. 1, the DDPA module 100 is programmable so that it facilitates circuit tuning procedure for designer and can fully take into account on circuit imbalance and imperfections for multiple paths. Therefore, the DDPA module 100 is not only flexible and low cost, but also provide better performance compared with analog DPA. The design according to an embodiment of the present invention benefits from software-designed principle so that the control ports can be adapted to reach the optimal performance through algorithms.

Making an RF power amplifier more efficient means driving it to a point near its point of saturation. In such a case, the modulated waveforms tend to be distorted (introducing nonlinearity characterized by ACPR-Adjacent channel power ratio). Thus, the design goal is to maximize the Power Added Efficiency (PAE), while maintaining high gain and good linearity (ACPR). In some cases, digital linearity can be achieved through Digital Pre-Distortion (DPD).

Figure 2:
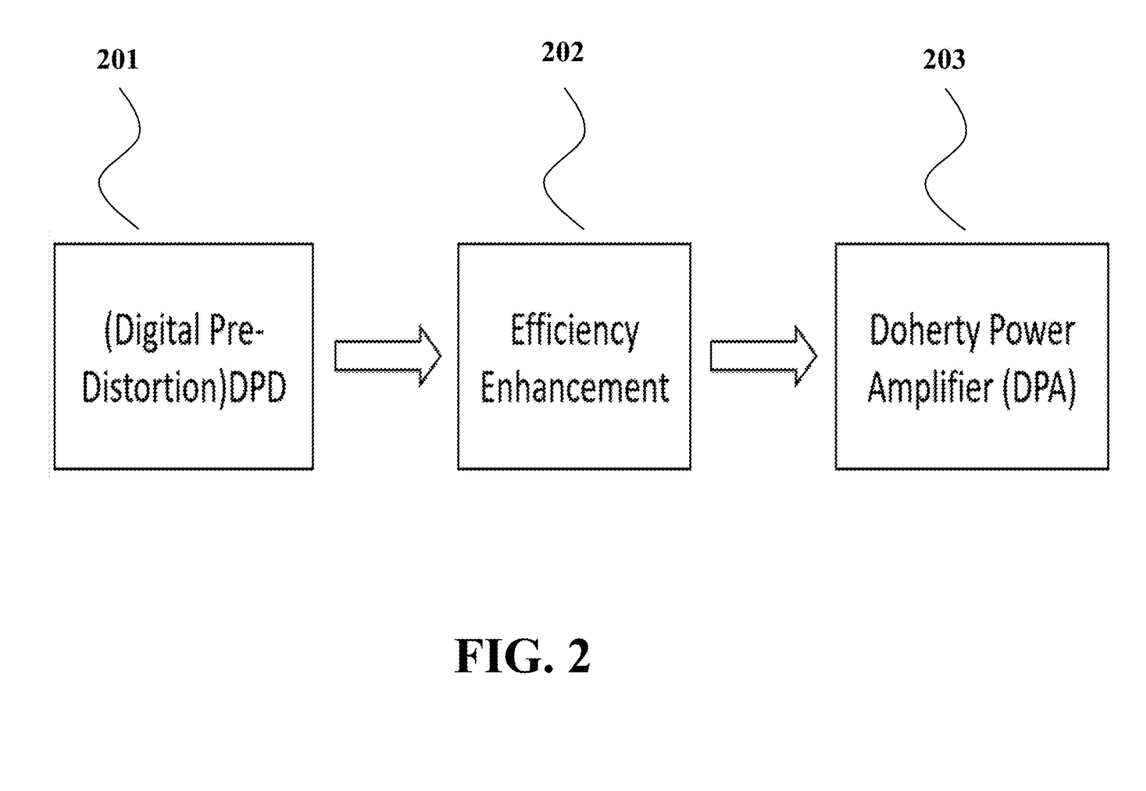
FIG. 2 is the framework structure for adaptive control (linearity, efficiency, and gain), according to some embodiments of the present invention.

FIG. 2 shows stages in improving linearity and efficiency of the PAs 121 and 122 through a DPD (Digital Pre-distortion) process 201 and an efficiency enhancement process 202 respectively. In the processes, the digital pre-distortion of input signals is performed in step 201, the efficiency enhancement is performed in step 202, and the input signals obtained by the processes through the digital pre-distortion (DPD) and the efficiency enhancement are provided to the PAs 121 and 121 in step 203.

Figure 3A:
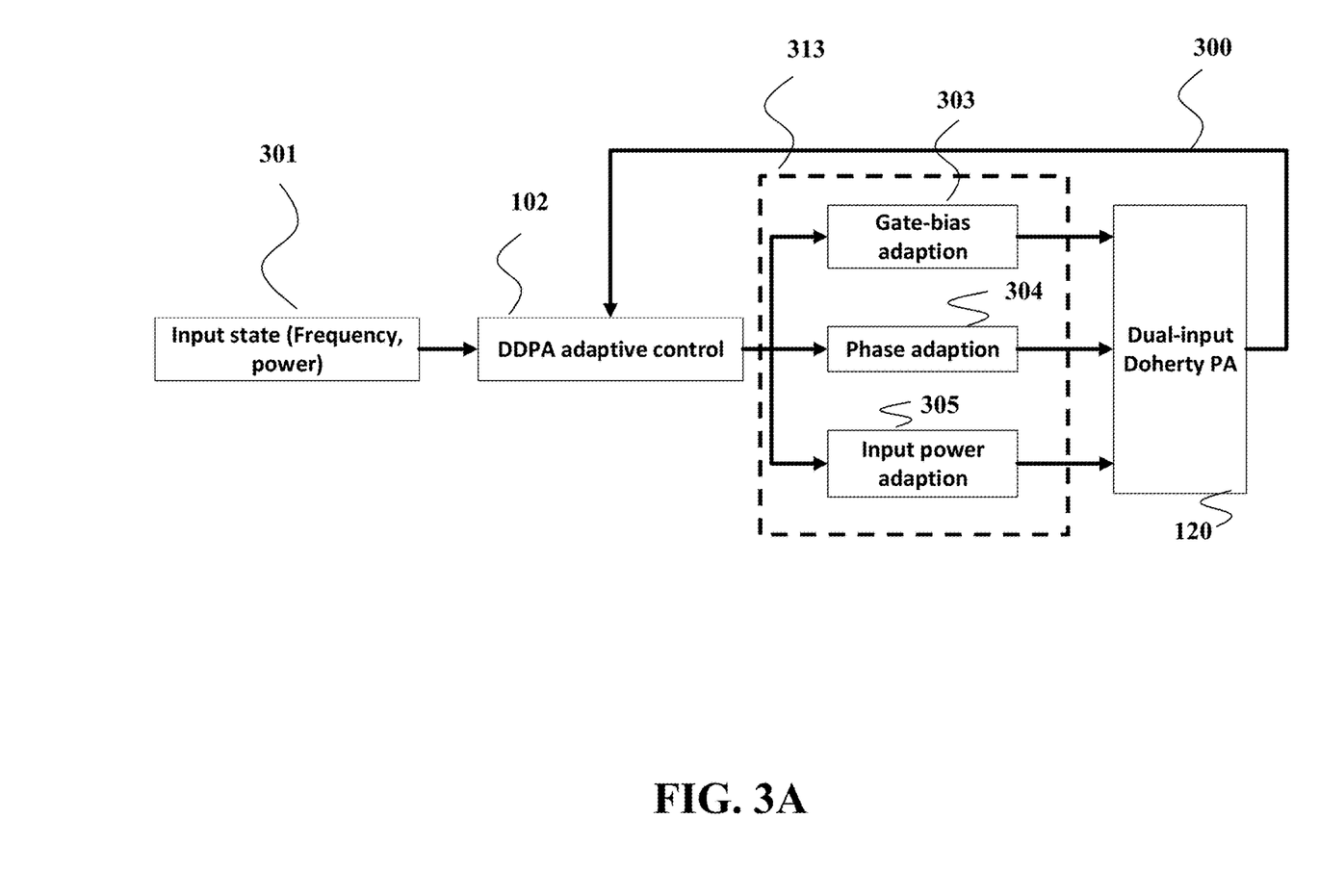
FIG. 3A is a block diagram of an adaptive control module for efficiency enhancement, according to some embodiments of the present invention.

FIG. 3A shows a detailed block diagram of our algorithm for PA auto-tuning where input signals (input state signals) 301 is used as an input state including different states indicating the Frequency and Input power level but not limited to these two states, other states such as signal modulation format can be included as well. The input state signal 301 indicating Frequency and Input signal power level is fed into the DDA adaptive control module 102 to adaptively tune the control parameters 313 of the DDPA 120 such as Gate-bias 303, phase difference 304 between main and peak amplifiers, and input power distribution 305, by using the input signal 301 and the output signal 330 of the dual input DPA module 120. Finally, tuned parameters are fed to the dual input DPA module 120.

According to circuit design variations, the DPA module 120 may include three or more than three power amplifiers (PAs). For instance, see FIG. 3B. In such a case, the DDA adaptive control module 102 provides control parameters 313 for each of the three or more than three power amplifiers.

Figure 3B:
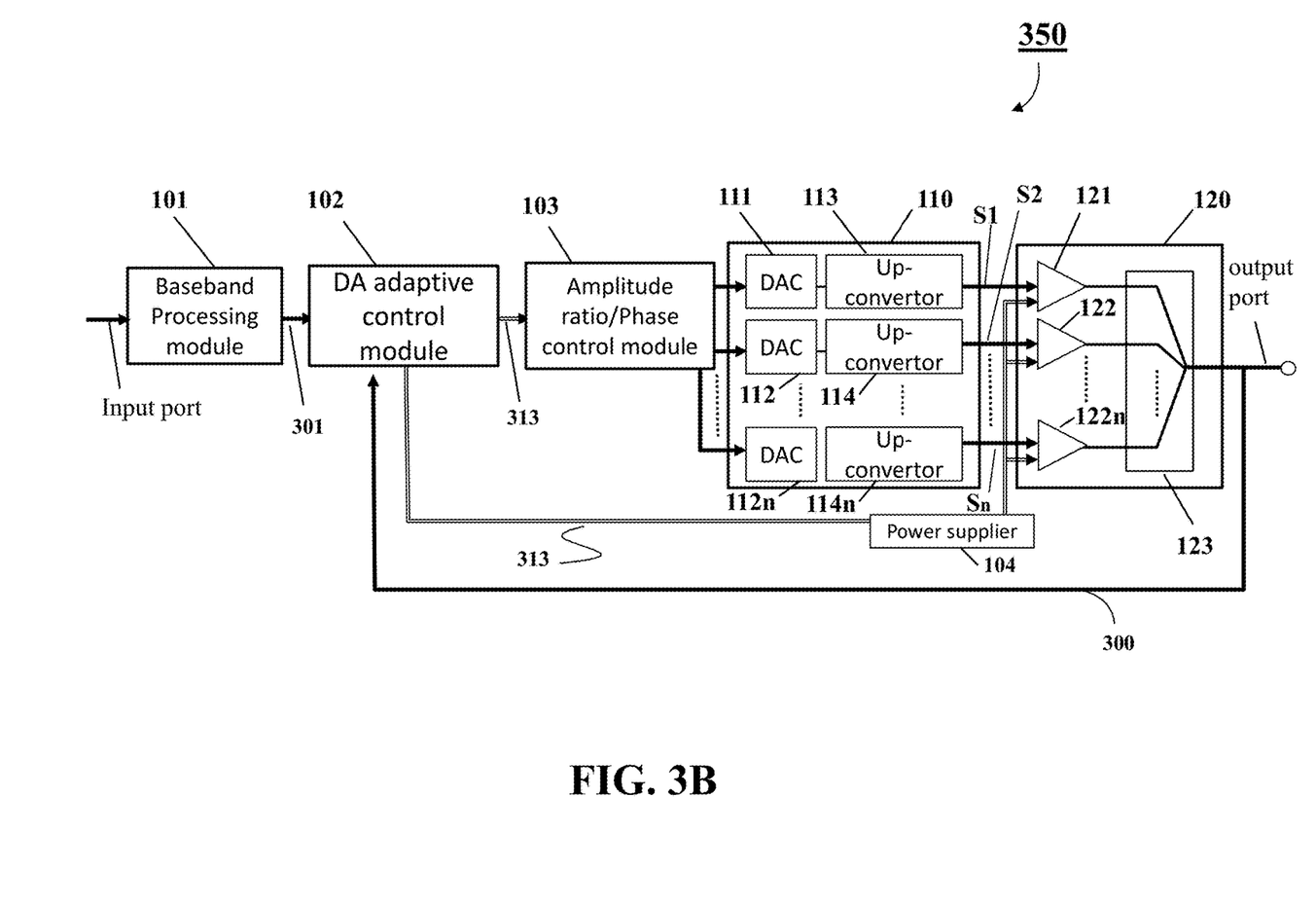
FIG. 3B is a block diagram of a digital power amplifier (DPA) adaptive control system, according to some embodiments of the present invention.

FIG. 3B is a block diagram illustrating a multi-input digital power amplifier module 350 that performs an auto-tuning process of a DPA module, according to embodiments of the present invention.

In the figure, identical part numbers in FIG. 1 are used for parts when the functions of the parts are similar to those in FIG. 1. Further, descriptions for the identical part numbers are omitted.

The multi-input digital power amplifier module 350 includes a baseband processing module 101, a DA adaptive control module 102, an amplitude ratio/phase control module 103, a signal convertor 110, and a multi-input PA module 120. In this case, the signal convertor 110 includes digital-to-analogue convertors (DACs) 111, 112 and 112$n$, and up-convertors 113, 114 and 114$n$.

The multi-input PA module 120 includes a carrier power amplifier (PA) 121 for controlling carrier signals and a peak power amplifier (PA) 122 for controlling peak signals, and a second peak power amplifier (PA) 122$n$ for controlling second peak signals, and an output combiner 123 for combining the signals from the PAs 121, 122 and 122$n$. In this case, the signal convertor 110 includes three or more than three DACs and three or more than three Up-convertors, and the multi-input PA module 120 includes three or more than three power amplifiers 121, 122 and 122$n$.

The DA adaptive control module 102 generates updated DPA parameters 313 using the input signals 301 and output signals 300 of the multi-input PA module 120, and provides the updated DPA parameters 313 to the Amp-phase module 103. Then the Amp-phase module 103 provides signals to the signal convertor 110 such that the signal convert generates S1, S2 and S2$n$ to be applied to the PA 121, the PA 122 and PA 122$n$, respectively.

As described above, the optimal control parameters 313 are computed using the adaptive control module 102. Detailed discussion regarding the optimal control parameters will be provided below.

Optimal Control Parameters

To search for the optimal control parameters θ* with maximum cost function Q(θ):

$$\theta^* = \underset{\theta \in U}{\mathrm{argmax}}\, Q(\theta)$$

The updates rule to find $\theta^*$ are based on model-free optimization algorithms, where $\theta$ is a vector of the amplifier tuning parameters defined as $\theta$=[Gate-bias$_{main}$,Gait-bias$_{peak}$,Power distribution, Phase difference].

Note that the control ports contain phase alignment component, and running phase shift on RF frequency is very challenging on digital circuit. To resolve the phase shift challenge, assuming we have baseband signal:

$$y_{IF}(t)=A_{IF}\cdot\sin(\omega_{IF}t+\varphi_{IF})$$

Assuming that $y_{LO}(t)=A_{LO}\cdot\cos(\omega_{LO}t+\varphi_{LO})$, and the modulated signal to RF can be written as:

$$y_{RF}(t)=y_{IF}(t)\cdot y_{LO}(t)$$

The phase shifted version can be written as:

$$y_{RF}(t+\Delta t)=y_{IF}(t+\Delta t)\cdot y_{LO}(t+\Delta t)$$

Note that the phase shift components in RF frequency written in baseband signal can be ignored ($y_{IF}(t+\Delta t) \approx y_{IF}(t)$), then, we have:

$$y_{RF}(t+\Delta t)=y_{IF}(t)\cdot y_{LO}(t+\Delta t)$$

The phase shift components can be replaced by shifting the phase of up converter. A programmable phase shifter is another alternative to implement the phase align, which needs carefully to choose tuning range in order to obtain high resolution and additional cost.

Figure 4:
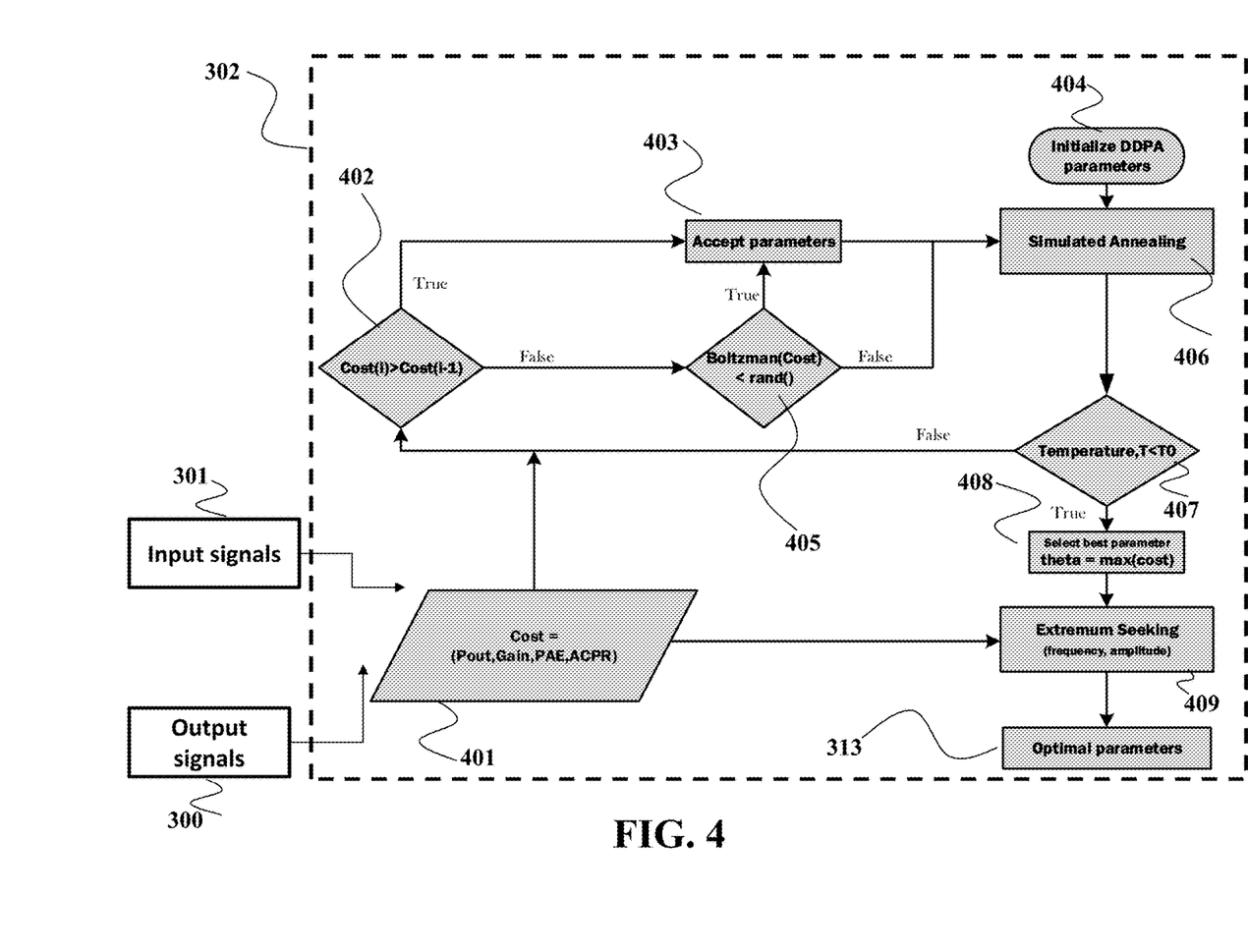
FIG. 4 is the flow chart for Simulated annealing (SA)+ Extremum Seeking (ES) based DDPA optimization, according to some embodiments of the present invention.

In one embodiment of the current invention, we implemented as a model free optimization method the simulated annealing (SA) plus extremum seeking (ES) shown in FIG. 4. The combination of SA 406 and ES 409 makes the system hybrid where SA 406 captures the random and abrupt variation in the model mainly due to frequency and input power variations whereas ES 409 captures the slow variation in the model due to temperature. FIG. 4 explains the hybrid algorithm for DDPA optimization. The algorithms described below can be stored into the memory of the DA adaptive control module 102 as programs (instructions) to be executed by the processor in the module 102.

In one embodiment, we choose the cost function, $Q(\theta)$ 401 as $$Q(\theta)=\mathrm{Gain[dB]}+0.01*\mathrm{PAE[\%]}+a_1\mathrm{Pout[dBm]}+a_2\mathrm{ACPR[dBc]} \quad (8)$$

Where Gain is the Gain of the amplifier in dB, PAE is the Power Added Efficiency in %, Pout is the Power output of the amplifier in dBm, ACPR is the Adjacent Channel Power in dBc, and $a_1$ and $a_2$ are number greater than 100 to makes sure that ACPR[dBc] and Pout[dBm] have been assigned the significant factors which are crucial in modulated signals.

To search optimal control parameters $\theta^*$ with maximum cost function $Q(0)$ 401, we implement the model-free optimization algorithm based on the two following phases:

Phase One: Exploration Phase:

Start with a random initial point $\theta_0$ and Temperature, T 404. For each iteration randomly generate $\theta$ within the pre-defined boundary while decreasing the temperature T with a discount factor $\alpha$ as $T \leftarrow \alpha T$.

For each random move at $i^{th}$ iteration, determine the cost $Q(\theta, t)$ 401, and accept the move and store $\theta$ if $$Q(\theta,t)-Q(\theta,t-1)>0 \quad (10)$$

In case if the condition is not met, then by using Boltzmann condition 405, the random move can be accepted as follows, $$\mathrm{rand}[0,1] < e^{\left(-\frac{Q(\theta,t)-Q(\theta,t-1)}{T}\right)} \quad (11)$$

If the above conditions are not met, then that particular move is not accepted and the next random point is generated. We accept some random moves even though their cost is less than the previous cost 402 to avoid local minimums.

The above procedure repeated until the Temperature, T is above the threshold, $T_{stop}$.

Next, the best $\theta_{best}$ with the maximum cost $Q(\theta)$ is selected to find the best optimal parameters to achieve maximum cost within the explored set of values. Exploitation phase ensures to find the global optimum.

Next, in the second phase, the algorithm switches to extremum seeking once the DDPA achieves maximum cost within the explored set of values. The goal of the ES phase is to fine tune the values of the optimal parameters with a local search.

Figure 5:
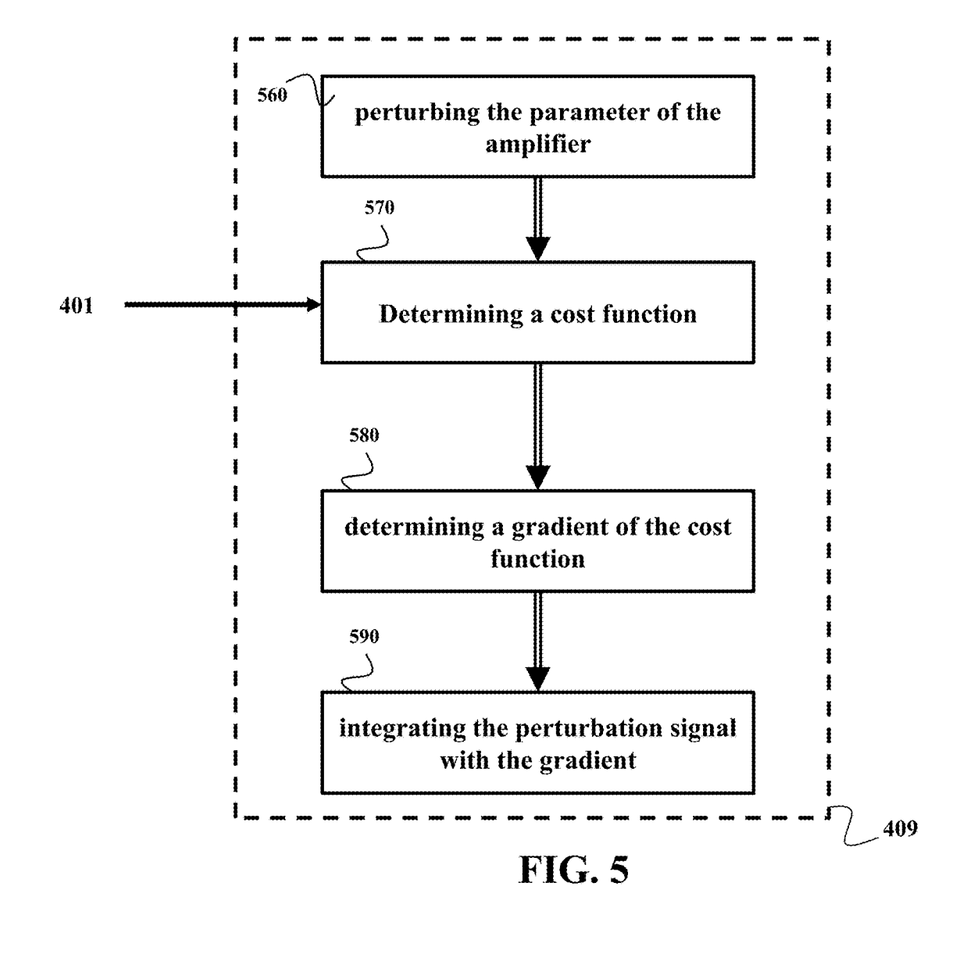
FIG. 5 is a flowchart of simplified ES, according to some embodiments of the present invention.

Phase Two: Exploitation Phase by Extremum Seeking:

FIG. 5 shows a block diagram of an extremum seeking (ES) method for updating the model of the amplifier. The extremum seeking iteratively perturbs the parameter of the amplifier with a perturbation signal having a predetermined frequency until a termination condition is met. For example, an iteration of the extremum-seeking perturbs 560 the parameter of the amplifier with the perturbation signal updated during a previous iteration of the extremum-seeking and determines 570, in response to the perturbing 560, a cost function of the amplifier performance. For example, the perturbation signal can include a periodic signal of the predetermined frequency.

Next, the iteration determines 580 a gradient of the cost function by modifying the cost function with the perturbation signal, and integrates 590 the perturbation signal with the gradient of the cost function to update the perturbation signal for a next iteration of the extremum-seeking. For example, the gradient of the cost function is determined as a product of the cost function, the perturbation signal and a gain of the extremum-seeking. The iterations of the extremum-seeking can be repeated until the termination condition is met.

Figure 6:
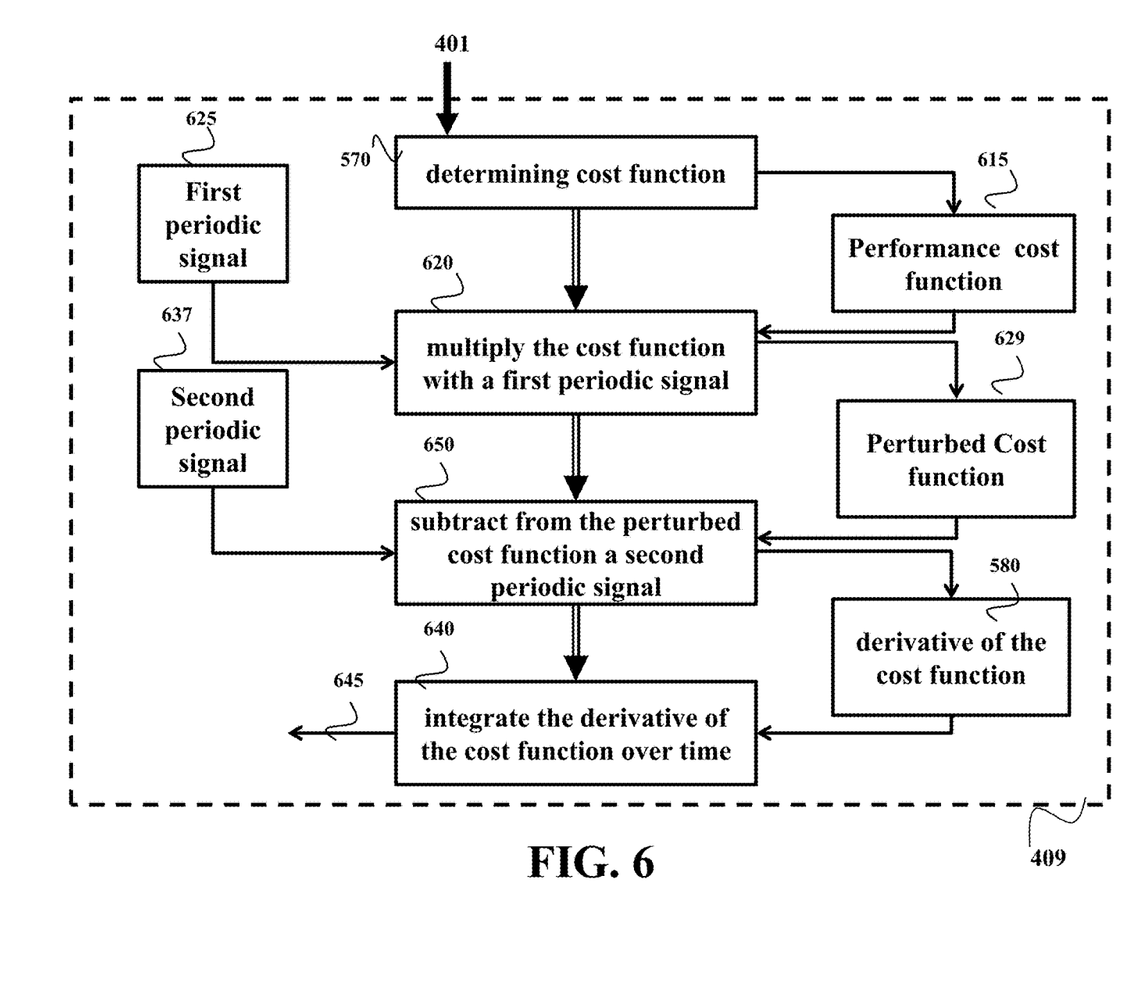
FIG. 6 is a flow chart of detailed ES algorithm, according to some embodiments of the present invention.

FIG. 6 shows a block diagram of the extremum seeking method that uses performance cost function according to some embodiments. The method determines a performance cost function 615. For example, the performance cost function 615 can include, the Power Added Efficiency (PAE), the gain, and the Adjacent Channel Power Ratio (ACPR). In step 620, the extremum seeking multiplies the cost function 615 with a first periodic signal 625 of time to produce a perturbed cost function 629, and subtracts (in step 650) from the perturbed cost function 629 a second periodic signal 637 having a ninety degrees' quadrature phase shift with respect to a phase of the first periodic signal 625 to produce a derivative 655 of the gain function. Further, in step 640, the extremum seeking method integrates the derivative of the gain function over time to produce the parameters values 645 as the function of time.

Figure 7:
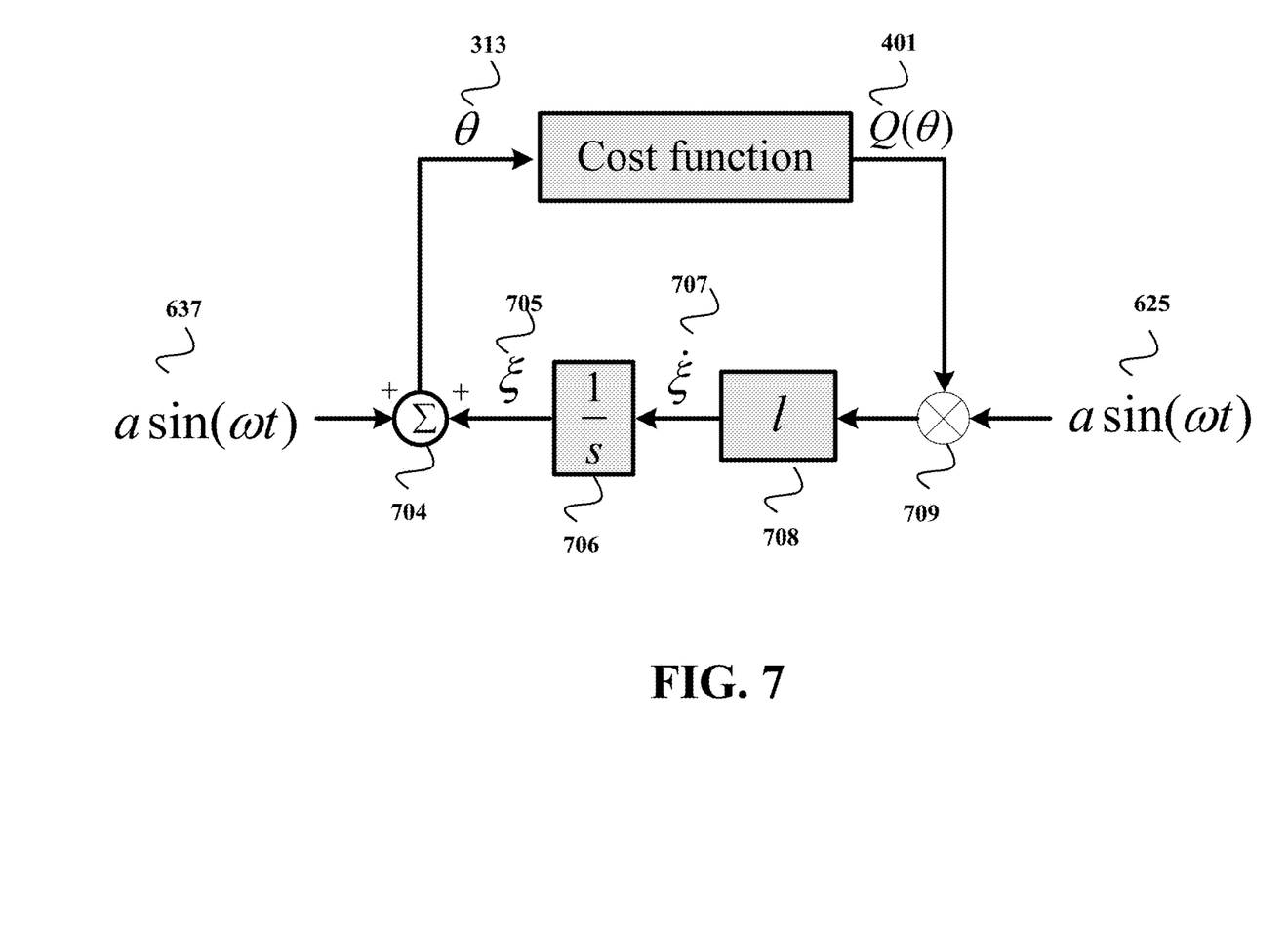
FIG. 7 Real time extremum seeking for one variable, according to some embodiments of the present invention.

FIG. 7 shows a schematic of an ES controller for the simple case of one tuning parameter, implementing the extremum seeking method illustrated in FIG. 6. The ES controller injects a sinusoidal perturbation a sin $\omega t$ 625 into the system, resulting in an output of the cost function Q(θ) 401. This output Q(θ) 401 is subsequently multiplied by a sin ωt 637. The resulting signal after multiplying a gain l, $\dot{\xi}$ 707, is an estimate of the gradient of the cost function with respect to the cost function θ. The gradient estimate is then passed through an integrator 1/s 706 and added to the modulation signal a sin ωt 637.

The extremum-seeking is a model-free learning method and therefore can be used for the amplifier parameters tuning. Also, there can be a need to update multiple parameters of the amplifier, in this case there is a need to use a multi-parameter ES.

Figure 8:
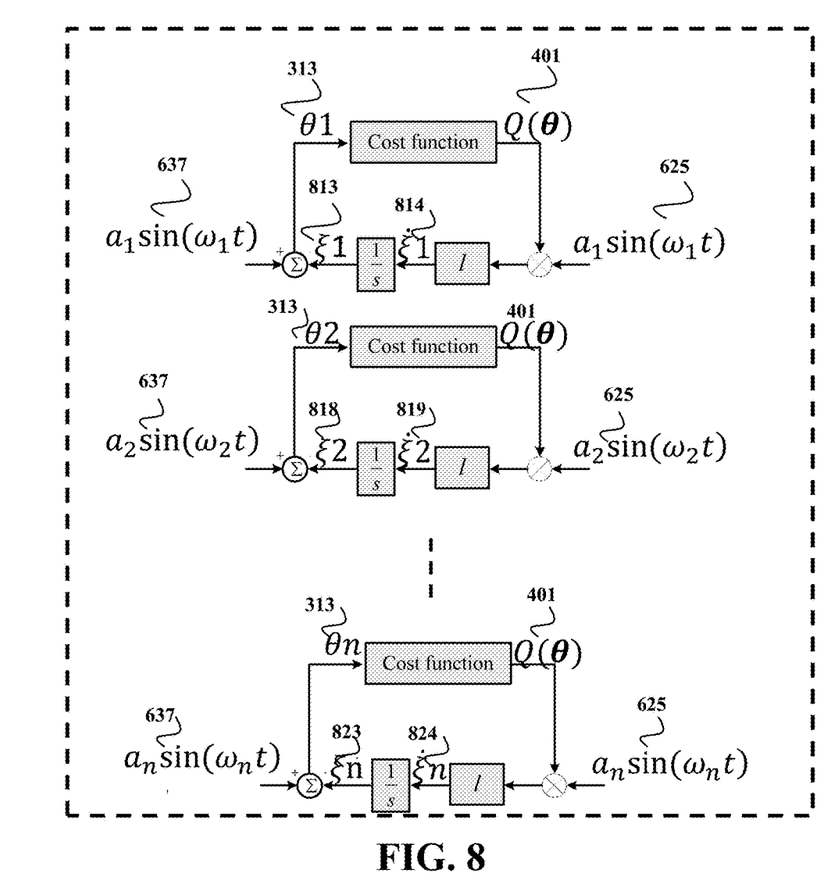
FIG. 8 Real time extremum seeking for multiple variables, according to some embodiments of the present invention.

FIG. 8 shows a schematic of a multi-parameter ES controller according to one embodiment. In this embodiment, the multi-parameter ES perturbs parameters in the set of parameters with corresponding perturbation signals having different frequencies to update the model stored in the memory. In some implementations, each of the different frequencies is greater than a frequency response of the battery. Additionally, or alternatively, in some implementations, the different frequencies of the perturbation signals satisfy a condition of convergence, such that a sum of a first frequency of a first perturbation signal and a second frequency of a second perturbation signal of the set is not equal to a third frequency of a third perturbation signal.

For example, when there are n parameters to estimate, the ES controller of FIG. 8 is duplicated n times, with n control parameters θ_i 313, n parameters ξ_i 813, 818, 823, n perturbation signals 625, 637, and one commune cost function 401, which is function of all the estimated control parameters θ=(θ_1, ..., θ_n)^T 313.

This multi-parameter ES can be described by equations as follows:

$$\dot{\xi}_i = a_i l \sin(\omega_i t) Q(\theta), \quad (3)$$

$$\theta_i = \xi_i + a_i \sin(\omega_i t), \quad (4)$$

where the perturbation frequencies ω_i s are such that ω_i≠ω_j, ω_i+ω_j≠ω_k, i, j, k, ∈{1, 2, n}, and ω_i>ω*, with ω* large enough to ensure the convergence. If the parameters a_i, ω_i, and l are properly selected, the cost function output Q(θ) converges to an neighborhood of the optimal cost function value Q(θ*).

In order to implement the ES algorithm in the real-time embedded system, a discrete version of the ES algorithm is advantageous. An exemplar discrete version of the ES algorithm is:

$$\xi_i(k+1) = \xi_i(k) + a_i l \Delta T \sin(\omega_i k) Q(\theta(k)), \quad (5)$$

$$\theta_i(k+1) = \xi_i(k+1) + a_i \sin(\omega_i(k)), \quad (6)$$

where k is the time step and ΔT is the sampling time.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A Digital Power-Amplifier (DPA) system comprising:
a power amplifier (PA) circuit having control inputs and an output for generating output signals; and
an adaptive control circuit comprises an input interface, an output interface, a memory storing an adaptive control algorithm and a processor performing instructions based on the adaptive control algorithm in connection with the memory, wherein the input interface receives input-state signals and output signals of the PA circuit, wherein the adaptive control algorithm determines, in response to the input-state signals and the output signals, control parameters of control signals transmitted to the control inputs from the output interface for controlling operations of the PA circuit, wherein the cost functions include a performance cost function and a perturbed cost function, wherein the adaptive control algorithm determines the control parameters by maximizing the cost function.

2. The DPA system of claim 1, wherein the processor selects cost functions to estimate the control parameters according to the adaptive control algorithm.

3. The DPA system of claim 1, wherein the performance cost function includes parameters of a Power Added Efficiency (PAE), a gain, and an Adjacent Channel Power Ratio (ACPR) with respect to the DPA circuit.

4. The DPA system of claim 1, wherein the PA circuit is an outphasing power amplifier circuit, a balanced power amplifier circuit or a push-pull power amplifier circuit, wherein the PA circuit comprises at least two power transistors and an output combiner to combine output signals of the power transistors.

5. The DPA system of claim 4, wherein the power transistors are field-effect-transistors (FETs).

6. The DPA system of claim 4, wherein the power transistors are formed from materials including gallium-nitride(GaN) material.

7. The DPA system of claim 2, wherein maximum cost function Q(θ) is defined as $$\theta^* = \underset{\theta \in U}{\operatorname{argmax}} Q(\theta),$$

and θ* are based on model-free optimization algorithms, where θ is a vector of the amplifier tuning parameters such as θ=[Gate-bias$_{main}$,Gait-bias$_{peak}$,Power distribution, Phase difference].

8. The DPA system of claim 1, wherein the PA circuit comprises more than three PAs, wherein the adaptive control circuit outputs more than three output signals.

9. A Digital Doherty Power-Amplifier (DDPA) system comprising:
a Doherty power amplifier (DPA) circuit having control inputs and an output for generating output signals; and
an adaptive control circuit comprises an input interface, an output interface, a memory storing an adaptive control algorithm and a processor performing instructions based on the adaptive control algorithm in connection with the memory, wherein the input interface receives input-state signals and output signals of the DPA circuit, wherein the adaptive control algorithm determines, in response to the input-state signals and the output signals, control parameters of control signals transmitted to the control inputs from the output interface for controlling operations of the DPA circuit,
wherein the cost functions include a performance cost function and a perturbed cost function, wherein the adaptive control algorithm determines the control parameters by maximizing the cost function.

10. The DDPA system of claim 9, wherein the processor selects cost functions to estimate the control parameters according to the adaptive control algorithm.

11. The DDPA system of claim 9, wherein the performance cost function includes parameters of a Power Added Efficiency (PAE), a gain, and an Adjacent Channel Power Ratio (ACPR) with respect to the DDPA circuit.

12. The DDPA system of claim 9, wherein the DPA circuit comprises at least two power transistors and an output combiner to combine output signals of the power transistors.

13. The DSPA system of claim 12, wherein the power transistors are field-effect-transistors (FETs).

14. The DPA system of claim 12, wherein the power transistors are formed from materials including gallium-nitride(GaN) material.

15. The DDPA system of claim 10, wherein maximum cost function Q(θ) is defined as $$\theta^* = \underset{\theta \in U}{\mathrm{argmax}} Q(\theta),$$

and θ* are based on model-free optimization algorithms, where θ is a vector of the amplifier tuning parameters such as θ=[Gate-bias$_{main}$,Gait-bias$_{peak}$,Power distribution, Phase difference].

16. The DDPA system of claim 1, wherein the DPA circuit comprises more than three PAs, wherein a number of output signals of the adaptive control circuit is identical to a number of the PAs.

17. A Digital Power-Amplifier (DPA) system comprising:
a power amplifier (PA) circuit having control inputs and an output for generating output signals; and
an adaptive control circuit comprises an input interface, an output interface, a memory storing an adaptive control algorithm and a processor performing instructions based on the adaptive control algorithm in connection with the memory, wherein the input interface receives input-state signals and output signals of the PA circuit, wherein the adaptive control algorithm determines, in response to the input-state signals and the output signals, control parameters of control signals transmitted to the control inputs from the output interface for controlling operations of the PA circuit, wherein the cost functions include a performance cost function and a perturbed cost function, wherein the performance cost function includes parameters of a Power Added Efficiency (PAE), a gain, and an Adjacent Channel Power Ratio (ACPR) with respect to the DPA circuit.

* * * * *